United States Patent [19]
Maochuan et al.

[11] Patent Number: 5,565,804
[45] Date of Patent: Oct. 15, 1996

[54] SIGNAL SWITCHING CIRCUIT

[75] Inventors: Chang Maochuan; Cheng Ya-an, both of Taoyuan, Taiwan

[73] Assignee: Acer Peripherals, Inc., Taoyuan, Taiwan

[21] Appl. No.: 497,203

[22] Filed: Jun. 30, 1995

[51] Int. Cl.$^6$ ................................................. H03K 17/00
[52] U.S. Cl. ............................. 327/99; 327/403; 327/407; 327/411
[58] Field of Search ............................... 327/99, 379, 384, 327/365, 407, 403, 411, 63, 65, 69, 70

[56] References Cited

U.S. PATENT DOCUMENTS

| | | | |
|---|---|---|---|
| 5,196,733 | 3/1993 | Shin | 327/379 |
| 5,204,982 | 4/1993 | Cooperman | 455/295 |
| 5,237,573 | 8/1993 | Dhuey et al. | 370/112 |
| 5,262,681 | 11/1993 | Takeda | 327/407 |
| 5,289,048 | 2/1994 | Ishihara et al. | 327/407 |
| 5,298,810 | 3/1994 | Scott et al. | 327/407 |

*Primary Examiner*—Timothy P. Callahan
*Assistant Examiner*—Kenneth B. Wells
*Attorney, Agent, or Firm*—Fish & Richardson P.C.

[57] ABSTRACT

A signal switching circuit is provided to output signal switching between a first and a second input signal. The circuit includes a first analog switch transistor, a first switch transistor, a second analog switch transistor, a second switch transistor and a third switch transistor. The interference between the first input signal and the second input signal is reduced to a possible minimum through the invention.

4 Claims, 3 Drawing Sheets

SIGNAL SWITCHING CIRCUIT

TECHNICAL FIELD OF INVENTION

The invention relates to a signal switching circuit and, in particular, relates to the signal switching circuit capable of preventing crosstalk between the input signal sources.

BACKGROUND OF THE INVENTION

Conventional display devices typically have two channels for transmitting signals with different characteristics.

As shown in FIG. 1 of one conventional connection arrangement of a display device, the display device 11 is coupled to a personal computer 13 and a workstation 15 at the same time via signal leads 131, 151 respectively. The personal computer 13 outputs DSB type signal 131 to the display device 11 and the workstation 15 outputs BNC type signal 151 to the display device 11. It is well known in the arts that the BNC type signals and the DSB type signals are transmitted via cables of 5 leads (pins) and 15 leads (pins) respectively. The personal computer 13 may be coupled to the workstation 15 through a network line 153. It is well known in the art that the DSB type signal 131 has a relative lower frequency as compared to a relative higher frequency the BNC type signal 151 has.

As shown in FIG. 2 of another conventional connection arrangement of a display device, a workstation 21 outputs the text information of lower frequency and the graphics information of higher frequency to the display device 23 via the DSB signal lead 211 and BNC signal lead 213 respectively.

In the configurations shown in FIG. 1 and FIG. 2, the display device, responsive to a switch command input from the front panel of the display device by the user, displays the information corresponding to the selected DSB or BNC type signals.

In the following elaborations of the conventional signal switching circuit or the instant invention, only the circuit corresponding to the RED gun of the display device is shown and recited for sake of simplicity. The disclosed circuit and corresponding recitation are also readily applied to GREEN and BLUE guns in a similar manner for persons of ordinary skill.

In one conventional signal switching circuit for DSB and BNC signals, as shown in FIG. 3, the microprocessor (not shown) within the display device outputs a DBBNC signal 35 to control the switching between the DSB and BNC signals. The RED output terminal 37 is formed at the terminal connecting the emitters of the analog switch transistors Q100 and Q102. When the DBBNC signal 35 is 0 volt (logic low), the transistor Q193 is cutoff and the transistor Q192 is saturated. The bases of the transistors Q100 said Q102 have voltage values around 0.8 volts. The cathode of the diode D1 has a voltage value higher than its anode and, accordingly, D1 is off. The base of Q100 has a voltage value of 1.8 volts, the emitter of Q100 has a voltage of 2.5 volts and, accordingly, Q100 is active. In another respect, the cathode of the diode D2 has a voltage value lower than its anode and, accordingly, D2 is conducting. The voltage potential of the base of the transistor Q102 is elevated to 3.5 volts and, accordingly, Q102 is cut-off. Under the aforesaid condition, the video signal input to the BNC signal lead 31 is output to the RED output lead 37 and utilized by downstream circuits in a well known manner.

On the contrary, as DBBNC signal 35 is 5 volts (logic high), the video signal input to the DSB signal lead 33 is output to the RED output lead 37 and utilized by downstream circuits in a well known manner.

By analyzing the circuit in FIG. 3, it is found, in unexpected situations where the DSB channel has input signals of higher frequency, cross-talk between the input signals 31, 33 occurs resulting from the appreciable effect of capacitance existing between the collector and base terminals of the analog switch transistor Q100 or Q102. As a result, when the information corresponding to the DSB type signal 33 is being displayed on the display device, the interference effect from the BNC source 31 accompanies the display information. And, vice versa, when the information corresponding to the BNC type signal 31 is being displayed on the display device, the interference effect from the DSB source 33 accompanies the display information.

SUMMARY OF THE INVENTION

To solve the aforesaid drawback, the instant invention provides a signal switching circuit immune from the crosstalk phenomenon between the signals received by the switching circuit.

A signal switching circuit provided by the instant invention comprises a first switch transistor, a second switch transistor, a third switch transistor, and a fourth switch transistor and a fifth switch transistor for selectively outputting at an output terminal a first signal and a second signal in response to a switching signal.

The first switch transistor has a base, an emitter and a collector. The base is AC-coupled to a second signal source. The first switch transistor has a base, an emitter and a collector. The collector is coupled to the base of the first switch transistor via a first resistor. The base receives the switching signal. The third switch transistor has a base, an emitter and a collector. The base is AC-coupled to a fourth signal source. The second switch transistor has a base, an emitter and a collector. The collector is coupled to the base of the third switch transistor via a second resistor. The emitters of the first and third switch transistors are coupled together to form the output terminal. A fifth switch transistor has a base, an emitter and a collector. The base receives the switching signal. The base of the fourth switch transistor is coupled to the collector of the fifth switch transistor.

BRIEF DESCRIPTION OF THE APPENDED DRAWINGS

DETAILED DESCRIPTION OF THE PREFERRED EMBODIMENT

Figure 1:
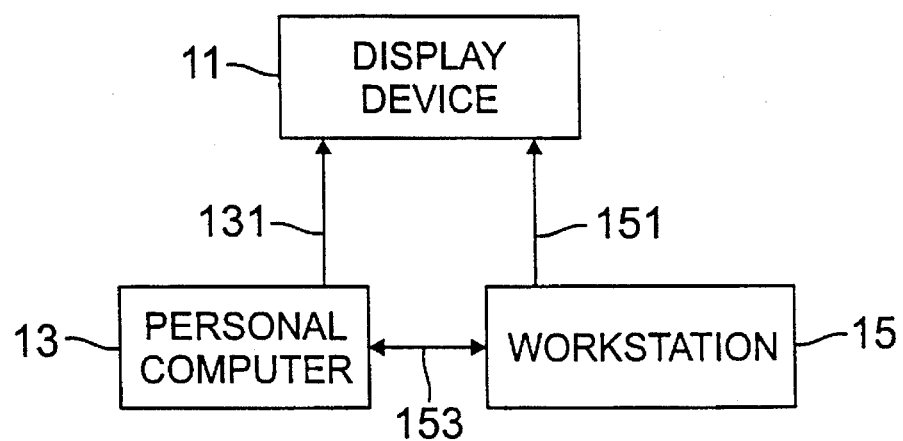
FIG. 1 depicts a typical connection arrangement of a display device to a personal computer and a workstation.
Figure 2:
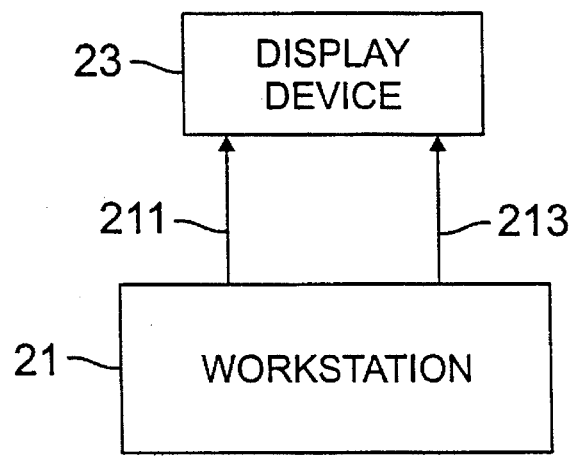
FIG. 2 shows a display device coupling to a workstation and inputing the BNC and DSB type signals selectively.
Figure 3:
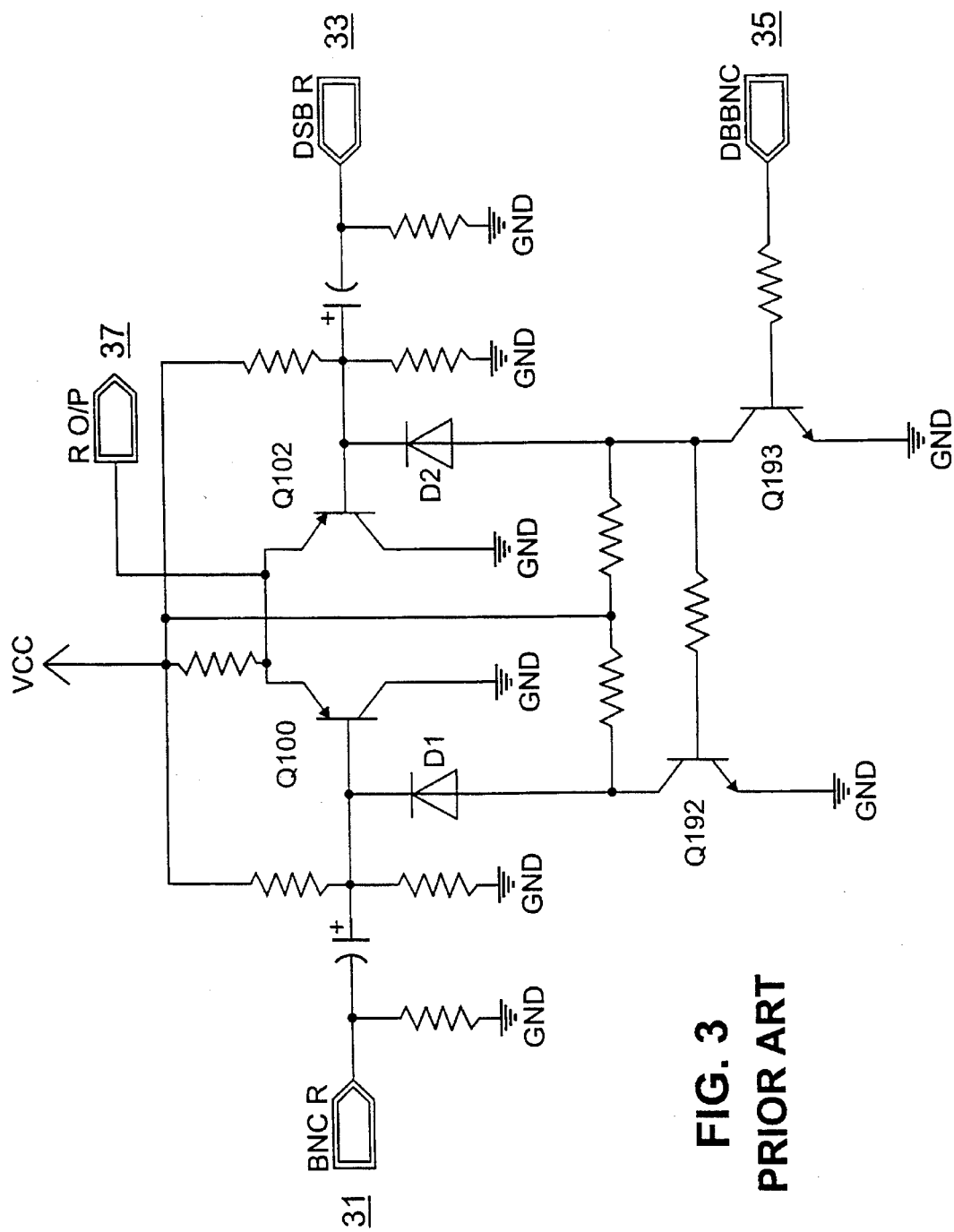
FIG. 3 shows one typical signal switching circuit, in accordance with the prior art, for switching between the BNC and DSB type signals.
Figure 4:
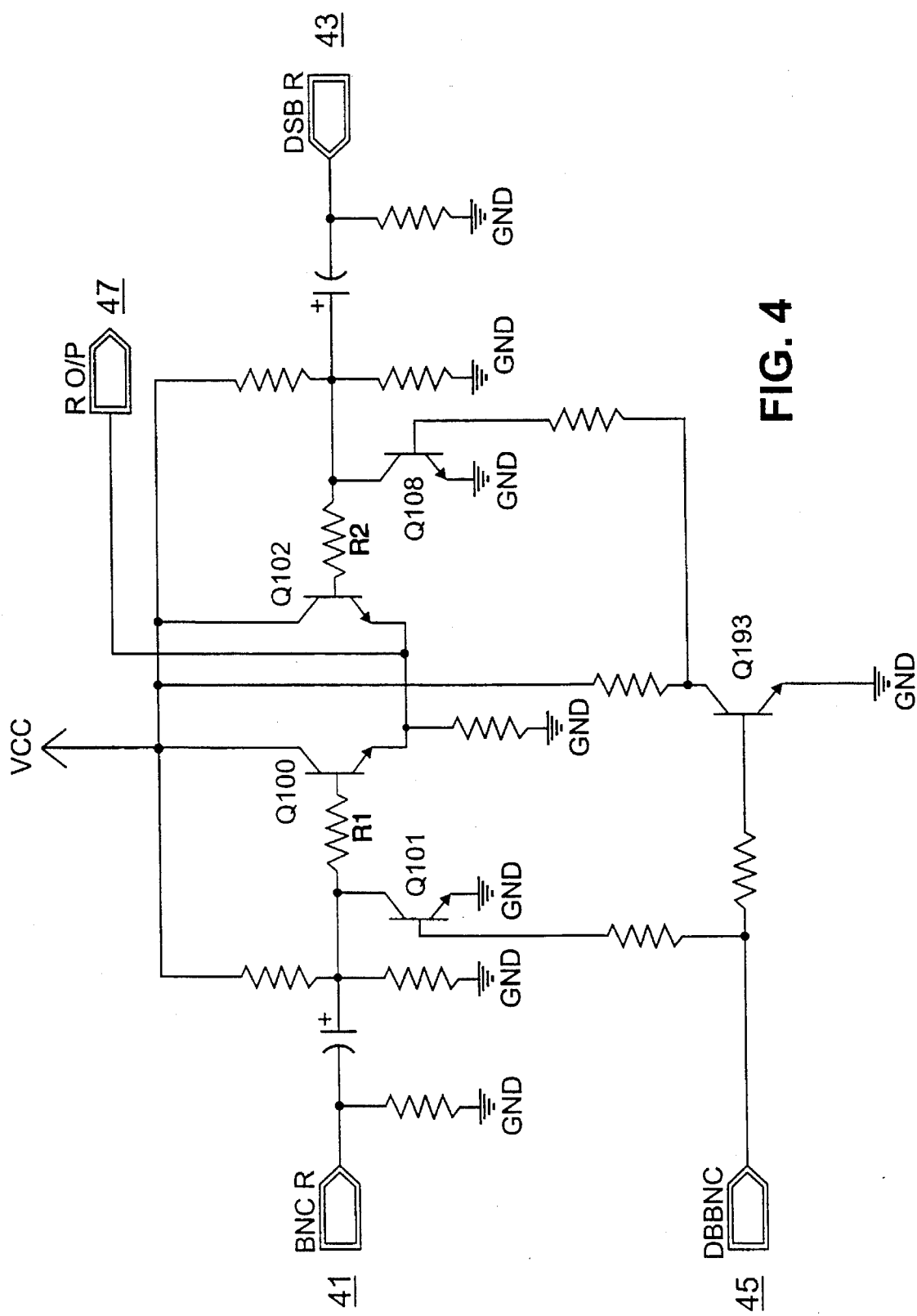
FIG. 4 shows the signal switching circuit in accordance with the instant invention.

As shown in FIG. 4, the switching circuit of the instant invention includes a first switch transistor Q100, a second switch transistor Q101, a third switch transistor Q102, a fourth switch transistor Q108 and a fifth switch transistor Q193.

The first switch transistor Q100 has a base, an emitter and a collector terminal. The base terminal is AC-coupled to a first signal source 41.

The first switch transistor Q101 has a base, an emitter and a collector terminal. The collector terminal is coupled to the base of the first switch transistor Q100 via a first resistor R1. The base terminal receives a switching signal 45.

The fifth switch transistor Q193 has a base, an emitter and a collector terminal. The base terminal receives the switching signal 45.

The third switch transistor Q102 has a base, an emitter and a collector terminal. The base terminal is AC-coupled to a second signal source 43.

The fourth switch transistor Q108 has a base, an emitter and a collector terminal. The collector terminal is coupled to the base of the third switch transistor Q102 via a second resistor R2. The base terminal of the fourth switch transistor Q108 is coupled to the collector of the fifth switch transistor Q193.

The emitters of the first switch transistor Q100 and the third switch transistor Q102 are coupled together for forming an output terminal 47. The switching circuit is responsive to the switching signal 45 and outputs at the output terminal 47 the first signal source 41 or the second signal source 43.

In one preferred embodiment, the first signal source 41 or the second signal source 43 has a voltage value from 0 to 0.7 volts or, in other words, the peak-to-peak voltage value is around 0.7 volts.

In one preferred embodiment, the first switch transistor Q100 and the third switch transistor Q102 are NPN type transistors.

The desired effect of the invention may be best understood by the following recitation with the assumption of switching signal 45 being 0 volts and the first signal source 41 being output.

When switching signal 45 is 0 volts, transistors Q193 and Q101 are cut-off, transistors Q100 and Q108 are conducting which forces the base terminal of Q102 to be 0.2 volts. Q102 is then cut-off, and the video signal 43 appearing on the base of Q102 is attenuated to 0.2 volts. This condition effectively forces the video signal 43 on channel DSB to be attenuated from 0.7 volts to 0.2 volts. The interference on the first signal source 41 on channel BNC due to the second signal source 43 is thereby reduced to a possible minimum.

On the other hand, as switching signal 45 is 5 volts and the second signal source 43 is output, the instant invention effectively forces the video signal 41 on channel BNC to be attenuated from 0.7 volts to 0.2 volts. The interference on the second signal source 43 due to the first signal source 41 is also thereby reduced to a possible minimum.

We claim:

1. A signal switching circuit for selectively outputting at an output terminal thereof a first analog signal or a second analog signal in response to a switching signal, comprising:

a first switch transistor having a base, an emitter and a collector, the base receiving the first analog signal;

a second switch transistor, having a base, an emitter and a collector, the collector being coupled to the base of the first switch transistor via a first resistor, the base receiving the switching signal;

a third switch transistor, having a base, an emitter and a collector, the base receiving the second analog signal;

a fourth switch transistor, having a base, an emitter and a collector, the collector being coupled to the base of the third switch transistor via a second resistor;

a fifth switch transistor, having a base, an emitter and a collector, the base receiving the switching signal;

wherein the base of the fourth switch transistor is coupled to the collector of said fifth switch transistor, and the emitters of said first and third switch transistors are coupled to each other for forming the output terminal.

2. The circuit as recited in claim 1, wherein the first and the second analog signals have voltage values ranging from 0 to 0.7 volts.

3. The circuit as recited in claim 1, wherein the first and the third switch transistors are of NPN type.

4. The circuit as recited in claim 1, wherein the first analog signal is AC-coupled to the base of the first switch transistor and the second analog signal is AC-coupled to the base of the third switch transistor.

* * * * *